United States Patent [19]

Aichelmann, Jr.

[11] 4,363,124
[45] Dec. 7, 1982

[54] RECIRCULATING LOOP MEMORY ARRAY TESTER

[75] Inventor: Frederick J. Aichelmann, Jr., Hopewell Junction, N.Y.

[73] Assignee: International Business Machines Corp., Armonk, N.Y.

[21] Appl. No.: 163,373

[22] Filed: Jun. 26, 1980

[51] Int. Cl.³ .......................................... G01R 31/28
[52] U.S. Cl. ...................................... 371/21; 371/25; 371/68
[58] Field of Search ............................ 371/25, 21, 68

[56] References Cited

U.S. PATENT DOCUMENTS

| | | | |
|---|---|---|---|
| 3,614,609 | 10/1971 | Gledd et al. | 371/25 |
| 3,680,069 | 7/1972 | Neumann et al. | 371/25 |
| 3,761,695 | 9/1973 | Eichelberger | 371/25 |
| 3,783,254 | 1/1974 | Eichelberger | 364/700 |
| 3,784,907 | 1/1974 | Eichelberger | 371/62 |
| 3,982,111 | 9/1976 | Lerner et al. | 371/21 |
| 4,001,818 | 1/1977 | Radichel et al. | 371/25 |
| 4,038,648 | 7/1977 | Chesley | 371/21 |

FOREIGN PATENT DOCUMENTS 2665014 3/1972 United Kingdom ................. 371/68

OTHER PUBLICATIONS

Amelio, Physics and Applications of Charge-Coupled Devices, IEEE Intercon., Mar. 26-30, 1973, pp. 1-6.
R. C. Varshney, CCD Memory with Testing Capability, IBM Tech. Discl. Bulletin, vol. 22, No. 10, Mar. 1980, pp. 4564-4565.

*Primary Examiner*—Charles E. Atkinson
*Attorney, Agent, or Firm*—Robert J. Haase

[57] ABSTRACT

Apparatus is disclosed for quickly testing memory arrays of multiple recirculating loop memory elements. All loops are loaded simultaneously with identical test bits in the same time required to load a single loop. The loaded data is verified by means of a comparison gate which ANDs the outputs of all elements and produces a data verification output signal only in the event that all of the data from each element is identical with that from all other elements on a serial bit-by-bit basis.

3 Claims, 4 Drawing Figures

RECIRCULATING LOOP MEMORY ARRAY TESTER

BACKGROUND OF THE INVENTION

1. Field of the Invention

The present invention generally relates to means for testing the constituent memory elements of computer memory arrays and, more particularly, to apparatus for quickly testing arrays comprising memory elements of the recirculating type, such as, for example, charge coupled devices.

2. Description of the Prior Art

In charge coupled device (CCD) memory arrays, multiple CCD loops are organized so as to be accessible via a single input pin and via a single output pin. Accordingly, the loops are accessed in serial succession. In those cases where the entire array is to be initialized to a predetermined state or tested to verify that the stored data is correct, sufficient time must be allocated to complete the serial accessing of the CCD loops. The required time increases objectionably as the CCD memory array increases in density to include larger numbers of individual loops. Direct parallel accessing of the individual CCD loops, on the other hand, permits much more rapid initialization, but only at the expense of requiring unacceptably large numbers of input-output (I/O) pins.

Indirect parallel accessing of interior logic circuit points has been achieved via single I/O pins according to a technique described in U.S. Pat. No. 3,783,254 to E. B. Eichelberger for "Level Sensitive Logic System", issued Jan. 1, 1974 and assigned to the present assignee and in related U.S. Pat. Nos. 3,761,695 and 3,784,907 to the same inventor. Briefly, clocked dc latches are provided at logic network nodes to be tested and additional circuitry is included to selectively connect the latches into a functional shift register. A predetermined pattern of binary ones and zeros can then be introduced serially into the shift register latches where they are retained for later use as parallel inputs to the logic network nodes to be dc tested. This technique, however, is not well suited for the initializing and dynamic testing of CCD loops within a memory array.

SUMMARY OF THE INVENTION

Memory arrays of multiple recirculating loop memory elements accessible via single I/O pins are quickly initialized to a predetermined condition for testing and other purposes by the bulk or parallel loading of all loops at the same time. The input data gate for each loop is modified to receive a bulk store input signal which, when present, allows the same data to be inputted simultaneously to all loops in parallel. Thus, all loops are loaded (initialized) with identical data in the same time required to load a single addressed loop. The necessity to address the loops in serial succession for such initializing purposes is eliminated without requiring any increase in I/O pins or in accessing time. In the same manner, test data patterns can be loaded into the loops in parallel and then the stored data can be verified by the provision of a comparison gate. The comparison gate receives an output from each loop as the loop recirculates the stored data. The loop outputs are ANDED by the comparison gate to produce a data verification output signal only in the event that all of the data received from each loop is identical with that from all other loops on a serial bit-by-bit basis.

DESCRIPTION OF THE PREFERRED EMBODIMENT

Figure 1:
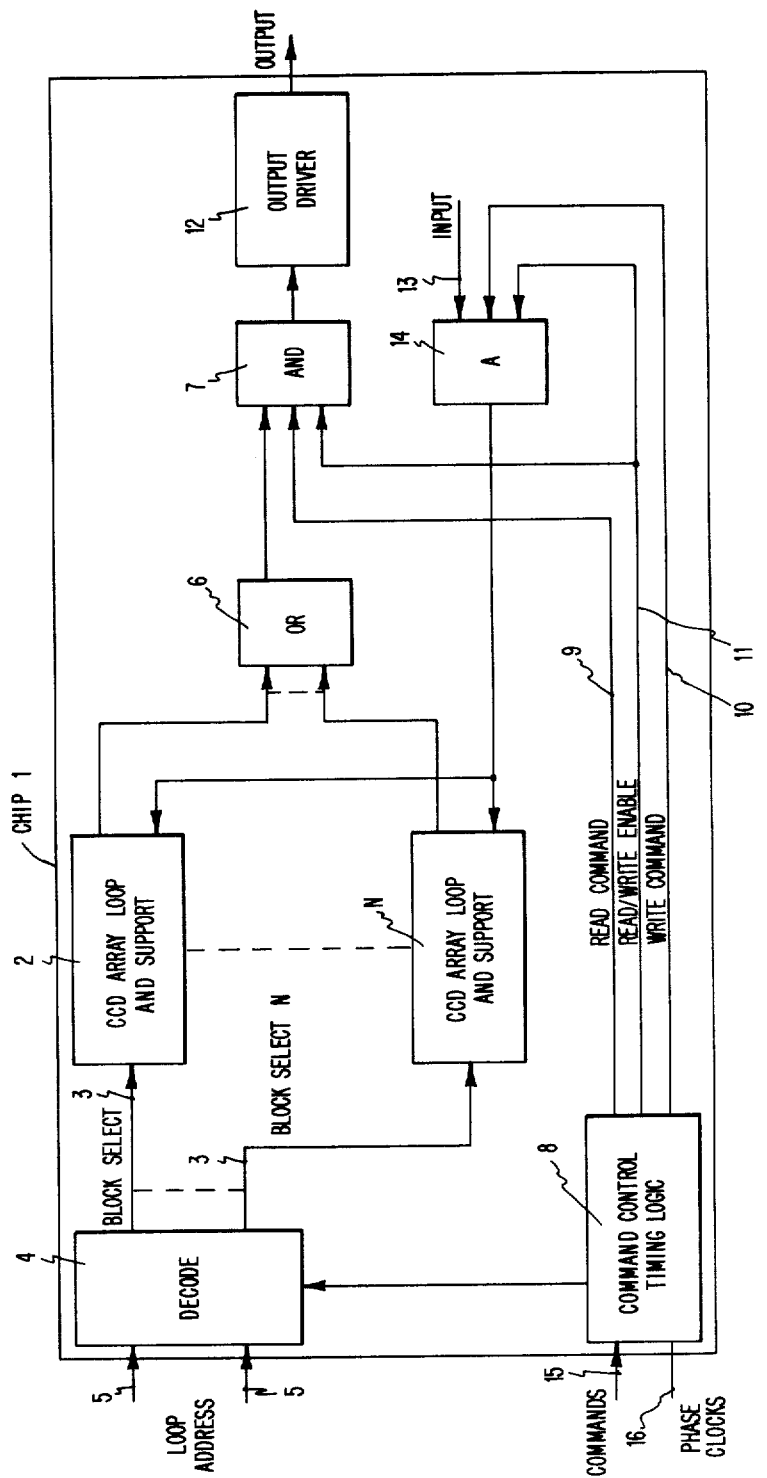
FIG. 1 is a simplified block diagram of a CCD memory array and its associated control circuitry adapted for single loop accessing.

Referring to FIG. 1, CCD memory array chip 1 comprises a multiplicity of recirculating CCD loops 2 through N which are individually addressable by respective loop select signals on lines 3 at the outputs of address decode 4. Loop address signals are applied via lines 5 from a source (not shown) located off chip 1. The serial bit outputs from each of the loops 2 through N are combined in OR circuit 6 and the selected (addressed) one of the loops is applied to one input of AND circuit 7. Circuit 7 also receives inputs from command control timing logic 8 comprising read command, write command and read/write enable signals on lines 9, 10 and 11, respectively. Timing logic 8, in turn, receives input command signals on line 15 and phase clocking signals on line 16. The output from circuit 7 is applied via output driver 12 to circuits (not shown) which are located off-chip. Input data is directed by line 13 to one input to AND circuit 14 which also receives the read/write enable and write command signals on lines 11 and 10, respectively.

In operation, each of the CCD loops 2 through N are addressed one at a time by the address signals appearing on lines 5. Data is written into the addressed loop upon the concurrence of signals on lines 13, 11 and 10. Data is read out from the addressed (selected) loop upon the concurrence of signals on lines 9 and 11 along with the output from OR circuit 6, all of which are applied to AND circuit 7. In the event that the entire memory array is to be initialized, i.e., set into a known state or states, for testing or other purposes, it is necessary that the input sequence of data bits be repeated as each of the memory loops is addressed in turn. Similarly, on verifying the correctness of the stored data, it is necessary that each loop be checked in turn by reading out the data stored therein and comparing it against the known input bit pattern.

Figure 2:
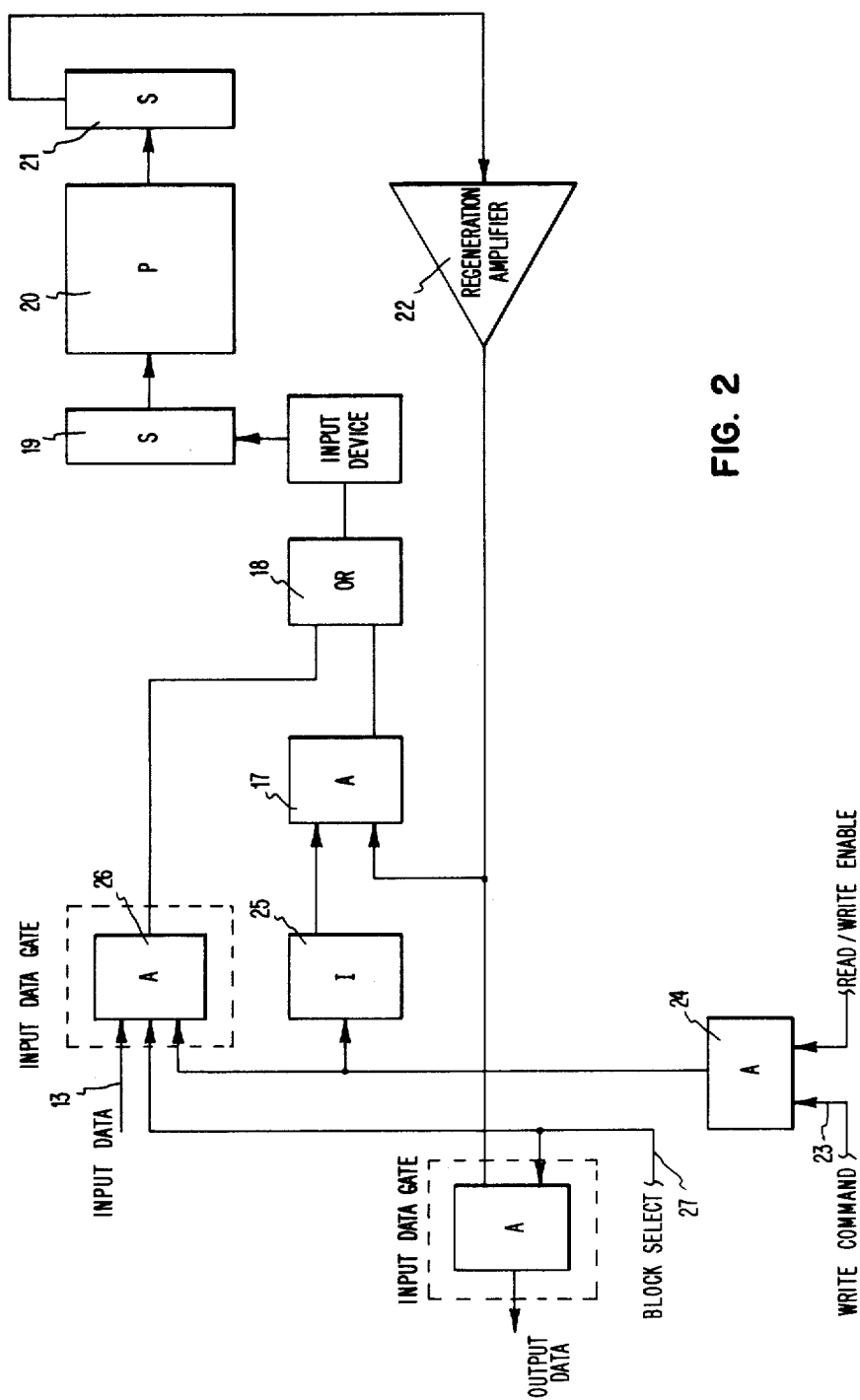
FIG. 2 is a more detailed block diagram of one of the CCD loops included within the array of FIG. 1.
Figure 3:
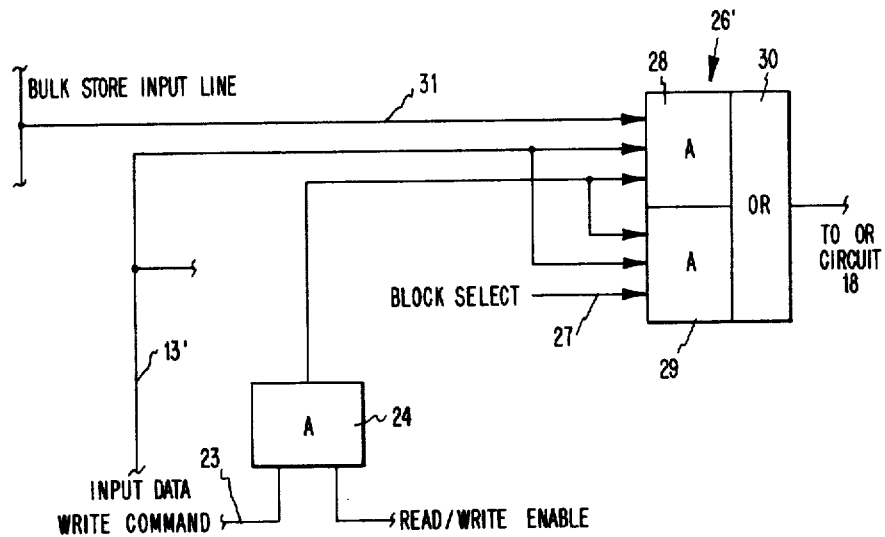
FIG. 3 shows a modification of the input data gate portion of FIG. 1 to adapt the array loops of FIG. 1 for bulk or parallel accessing.
Figure 4:
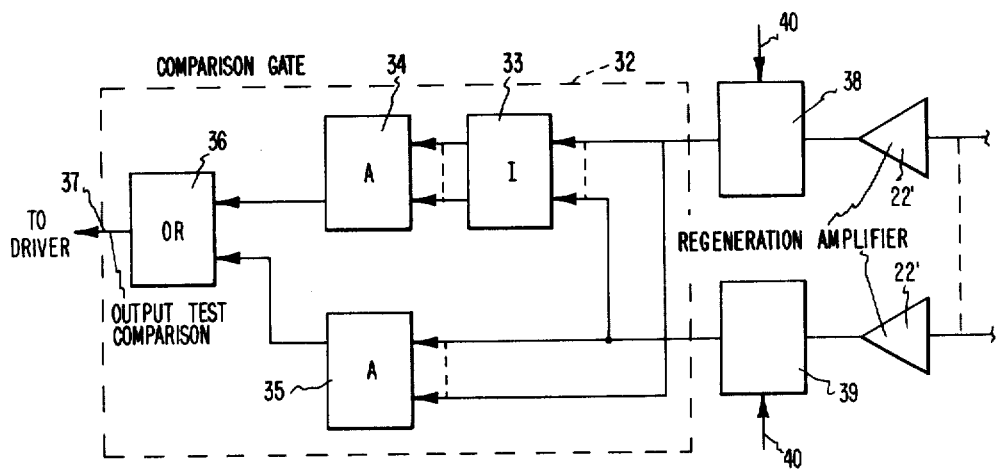
FIG. 4 shows a comparison gate, which when added to the structure of FIG. 1, permits rapid verification of the data stored in the array loops.

In accordance with the present invention, however, the initialization of the entire memory array as well as the verification of the stored data is accomplished in parallel in substantially the same time as required for a single loop by the addition of a minimal amount of circuitry represented in FIGS. 3 and 4. The manner in which the circuitry of FIGS. 3 and 4 are added to the array chip of FIG. 1 may be better understood by first considering the typical CCD loop, represented in more detail in FIG. 2 of the array of FIG. 1.

Referring now to FIG. 2, the typical CCD loop of FIG. 1 comprises AND circuit 17, OR circuit 18, series-parallel-series CCD registers 19, 20 and 21 and regenerative amplifier 22. The loop is completed for data recirculation upon the conduction of AND circuit 17 in the absence of a write command on line 23. When there is no write command, AND circuit 24 produces a zero output which is inverted (25) to render AND circuit 17 conductive to each of the recirculating data bits. The recirculating loop is broken upon the appearance of a write command on line 23 which also readers input data gate 26 conductive in the simultaneous presence of a respective loop selection (address) signal on line 27 (one of the loop selection signals on lines 3 of FIG. 1) and input data on line 13. Data is read out of the recirculating loop upon application of the address signal on line 27 and in the absence of a write command signal on line 23.

By the substitution of the input data gate 26' of FIG. 3 for gate 26 of FIG. 2, all of the CCD loops of FIG. 1 may be simultaneously written into in parallel for aarray initialization or testing purposes. Gate 26' comprises AND circuits 28 and 29 and OR circuit 30. AND circuit 29 receives the same signals as input data gate 26 of FIG. 2. AND circuit 28 is similarly connected except that bulk store line 31 is substituted for the block select line 27. It should be noted that the bulk store input line 31 is applied to the input data gates of all of the CCD loops of the array of FIG. 1. The outputs from circuits 28 and 29 are combined in OR circuit 30 for application to OR circuit 18 of FIG. 2.

Upon the presence of a respective block select signal on line 27 and the absence of a bulk store signal on line 31, the operation is the same as previously discussed in connection with the unmodified FIGS. 1 and 2. In the presence of a bulk store signal on line 31, however, the input data appearing on line 13' is applied simultaneously in parallel to all of the CCD loops comprising the array of FIG. 1.

The data simultaneously stored in the CCD loops can be verified in substantially the same time as required to read out a single CCD loop by the addition of the comparison gate 32 of FIG. 4 to the array of FIG. 1. The comparison gate comprises multi input inverter circuit 33, AND circuits 34 and 35 and OR circuit 36. The output from each regenerative amplifier 22' from each CCD loop in the array of FIG. 1 is directed via a respective data output gate (e.g., 38 and 39) to a respective input of both inverter circuit 33 and AND circuit 35. The data output gates are rendered conductive simultaneously by application of a bulk select signal to line 40. If all of the recirculating data bits simultaneously applied to inverter circuit 33 are "zeros", AND circuit 34 produces a binary "one" signal. AND circuit 35 produces a binary "one" if all of the recirculating data bits simultaneously applied thereto are "ones". Thus, in the event that the initialization data simultaneously stored in all of the CCD loops has been stored and retrieved from the loops without error, either AND circuit 34 or AND circuit 35 produces a binary "one" signal on line 37 for each of the recirculating data bits being compared. The appearance of a binary "zero" on line 37 signifies the occurrence of error in one or more of the CCD loops.

I claim:

1. Logic means on an array chip for testing the constituent recirculating loop memory elements of said array, said means comprising means for simultaneously addressing all of said elements and for loading said elements in parallel with the same test bits and single comparison gate means connected to the outputs of all said elements for ANDing said outputs to produce a first signal when all said outputs are identical on a serial bit-by-bit basis and to produce a second signal when all said outputs are not identical, wherein said comparison gate means comprises a multi input, multi output inverter circuit and first and second multi input AND circuits, means for applying said test bits from all said elements to respective inputs of said inverter circuit and to respective inputs of said first AND circuit, said second AND circuit being coupled to receive the multi outputs from said inverter circuit, and means for combining the outputs of said first and second AND circuits.

2. The apparatus defined in claim 1 wherein said means for simultaneously addressing comprises a respective input AND gate for inputting test bits into each of said elements and means for simultaneously applying a bulk store signal and said test bits to each said AND gate.

3. The apparatus defined in claim 2 wherein said elements are charge coupled devices.

* * * * *